(12) United States Patent
Chen et al.

(10) Patent No.: US 6,744,296 B1
(45) Date of Patent: Jun. 1, 2004

(54) CIRCUITS AND METHODS FOR ACCURATELY SETTING A PHASE SHIFT

(75) Inventors: Yuhui Chen, Fremont, CA (US); Mitchell E. Lee, San Jose, CA (US); Stephen W. Hobrecht, Los Altos, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/430,837

(22) Filed: May 5, 2003

(51) Int. Cl.[7] .............................................. H03K 5/13
(52) U.S. Cl. ...................................... 327/231; 327/246
(58) Field of Search .............................. 327/231, 233, 327/234, 235, 236, 237, 238, 243, 246, 254

(56) References Cited

U.S. PATENT DOCUMENTS

| | | | |
|---|---|---|---|
| 4,355,289 A | 10/1982 | Beyer et al. | 375/269 |
| 4,395,687 A | 7/1983 | Belohoubek | 327/248 |
| 4,549,152 A | 10/1985 | Kumar | 332/144 |
| 4,581,595 A | 4/1986 | Silagi | 333/139 |
| 4,870,374 A | 9/1989 | Harris | 332/174 |
| 5,317,200 A | 5/1994 | Nishiyama | 327/231 |
| 5,317,276 A | 5/1994 | Yamamoto | 327/254 |
| 5,317,285 A | 5/1994 | Chan | 331/16 |
| 5,317,288 A | 5/1994 | Yung et al. | 327/237 |
| 5,696,795 A * | 12/1997 | Williams et al. | 375/308 |
| 5,963,073 A * | 10/1999 | Fujita et al. | 327/254 |

OTHER PUBLICATIONS

Dallas Semiconductor Maxim Integrated Products, "Digitally–Controlled Phase Shift Using the DS1669", Application Note 184 APP 511: Mar. 29, 2001; URL: http://pdfserv.maxim–ic.com/an/en/app184.pdf.

Linear Technology, "LTC1629/LTC1629–PG PolyPhase, High Efficiency, Synchronous Step–Down Switching Regulators," Datasheet, 2000.

"Tech Brief 3: Digitally Control Phase Shift", *EDN Magazine's Design Ideas, APP 559:* Feb. 15, 1996, pp. 114–116; URL: http://www.maxim–ic.com/appnotes.cfm/appnote_number/559, printed Feb. 26, 2003.

* cited by examiner

*Primary Examiner*—Linh M. Nguyen
(74) *Attorney, Agent, or Firm*—Fish & Neave; Mark D. Rowland; Gabrielle E. Higgins

(57) ABSTRACT

Circuits and methods for providing an accurate phase shift between a generated output signal and an input signal are disclosed. The circuits and methods enable any amount of accurate phase shift to be set without requiring significant changes in circuitry with each phase shift. The phase shift is set by a voltage applied to a feedback amplifier connected to a low-pass filter and a timer circuit that resets a latch circuit.

26 Claims, 9 Drawing Sheets

CIRCUITS AND METHODS FOR ACCURATELY SETTING A PHASE SHIFT

FIELD OF THE INVENTION

This invention relates generally to phase-shift circuits. More specifically, the present invention provides circuits and methods for accurately shifting the phase of a signal by any programmed amount.

BACKGROUND OF THE INVENTION

A phase-shift circuit is one whose sole purpose is to shift the phase of an input signal to produce an output signal that is but of phase with the input signal. Two signals are out of phase when there is a relative displacement between the signals at a given point in time. For example, signals A and B shown in FIG. 1 are 90° out of phase. A is said to lead B by 90°, and, conversely, B is said to lag A by 90°. A simple phase-shift circuit such as shown in FIG. 2 may be used to shift an input signal by a certain degree depending on the value of resistor 25, capacitor 30, and the frequency of the input signal to generate a phase-shifted output signal.

Phase-shift circuits are useful in a number of diverse applications, including phase detection, modulation, high power and high frequency amplification, and voltage regulation involving multiple paralleled power supplies, among others. In these and most other applications, phase-shift circuits are used to provide a phase difference based on which other signals are generated or controlled.

For example, a phase-shift circuit is often used in combination with a phase detector circuit to provide a DC output voltage proportional to the phase difference between its input signals. A well-known phase detector circuit is the quadrature detector widely used in many communications applications, and in particular, in applications involving quadrature amplitude modulation and phase modulation. The quadrature detector uses a phase-shift circuit to provide quadrature input signals, i.e., input signals that are spaced 90° apart, to a phase detector. The phase detector produces different output voltages for different phase shifts to recover the modulation.

Examples of phase-shift circuits designed for communications applications include those described in U.S. Pat. No. 4,355,289, U.S. Pat. No. 4,549,152, U.S. Pat. No. 5,317,288, and U.S. Pat. No. 5,317,276. Such circuits either provide a limited number of phase shifts, e.g., multiples of 90°, or require a complex control signal or a control circuit to set the phase shift.

Phase-shift circuits may also be used to maintain phase linearity in high power, high frequency amplifiers as described in U.S. Pat. No. 4,581,595, and to control the phase of video signals transmitted according to the NTSC (National Television System Committee) and PAL (Phase Alternation by Line) standards, as described in U.S. Pat. No. 5,317,200. Similar to the phase-shift circuits designed for communications applications, these phase-shift circuits only provide a limited number of phase shifts.

Another application in which phase-shift circuits are useful is in voltage regulation involving multiple paralleled power supplies. A voltage regulator is a device that produces a predetermined and substantially constant output voltage from a source voltage that may be poorly-specified or fluctuating, or that may be at an inappropriate amplitude for the load.

One type of a commonly-used voltage regulator is a switching voltage regulator. Switching voltage regulators employ one or more power devices as the switching elements and inductors, transformers, and capacitors as energy storage elements between the source and the load. The switching elements may be, for example, power metal-oxide semiconductor field-effect transistor (MOSFET) devices. A switching voltage regulator regulates the voltage across the load by varying the ON-OFF times of the switching elements so that power is transmitted through the switching elements and into the energy storage elements. The energy storage elements then supply this power to the load so that the load voltage is regulated.

Multiple switching voltage regulators are often paralleled together in a single system to produce multiple disparate output voltages or to produce a higher output current. In this case, it is preferable to have all switching voltage regulators synchronized to the same operating frequency. Proper application of synchronization consolidates the spectral content of the noise in the system due to the use of multiple regulators, reduces noise filtering requirements, and eliminates the enharmonic hetrodynes in the system, i.e., the "beat frequencies" arising from the sum of and difference between the different frequencies of the multiple regulators.

In addition to synchronization, it is also desirable to have multiple switching voltage regulators interleaved when they are sharing the same input rail. An interleaved system employs a phase-shift circuit to provide a constant phase difference between any two regulators, i.e., the phase difference between any two regulators is constant regardless of changes in other operating parameters. The phase difference between any two regulators depends on the number of regulators (or phases) in the system, e.g., 180° (360°/2) for a two-phase system, 120° (360°/3) for a three-phase system, 90° (360°/4) for a four-phase system, 72° (360°/5) for a five-phase system, etc.

When properly interleaved, the system input RMS current is minimized and the frequency of the input ripple current is effectively multiplied, thereby enabling the use of a smaller input capacitor and reducing the power loss that arises from resistances in fuses, printed circuit board traces, connectors, input capacitance equivalent series resistances ("ESRs"), among others. Further, when multiple switching voltage regulators are interleaved to provide a single output, the steady-state output ripple voltage is significantly reduced and the dynamic load transient response is significantly improved over a non-interleaved configuration. Examples of control integrated circuits for multiple interleaved switching regulators include LTC1628, LTC1629, and LTC3728, provided by Linear Technology Corporation, of Milpitas, Calif. These switching regulator controllers employ two switching regulators to produce one (LTC1629) or two (LTC1628, LTC3728) regulated outputs.

To provide a multi-phase interleaved system, it is necessary to use phase-shift techniques or phase-shift circuits between any two switching regulators. One approach that does not require any additional phase-shift circuitry between two regulators involves using the inherent phase-shifted signal from the first regulator to synchronize the internal clock of the second regulator. For example, in a synchronous Buck converter, the bottom gate drive signal of the first regulator, i.e., the signal that drives the bottom switching element of the first regulator, is used to synchronize the internal clock of the second regulator.

This approach suffers from two major drawbacks. First, when the first synchronous Buck regulator is subjected to load or line changes, its bottom gate signal shifts in phase, thereby introducing a temporary frequency deviation in the second regulator. That is, the phase difference between the first regulator and the second regulator is not constant with varying load or voltage levels. Second, the phase difference between the first regulator and the second regulator is fixed by the duty cycle of the fist regulator and is usually not optimized. With many switching voltage regulators having different duty cycles at different operation modes, e.g., continuous current mode, discontinuous current mode, and other power-savings modes, this approach does not guarantee constant phase differences between the two regulators or does not work when the bottom gate of the first regulator is turned off during a power-savings mode.

Another approach that may be used to provide a phase difference between two regulators is to apply the gate drive signal of the first regulator, i.e., the signal that drives the switching element of the first switching voltage regulator, as input to R-C circuit 20 shown in FIG. 2 to synchronize the internal clock of the second switching voltage regulator. This approach is also very simple, but suffers from three major drawbacks. First, similar to the approach discussed above, the phase shift is limited by the duty cycle of the first regulator. Second, the amount of phase shift that can be achieved is highly dependent on the input voltage, that is, the phase difference between the first regulator and the second regulator is not constant with varying voltage levels. Third, the phase shift is not accurate because of the tolerance of capacitor 30 in R-C circuit 20 and its impedance variation over frequency, i.e., its frequency sensitivity, resulting in different phase shifts for different frequencies. Another source of inaccuracy may be caused by the synchronization input voltage threshold variation of the second switching voltage regulator.

To address the limitations of the phase-shift circuits described above with respect to phase shift variations due to the first regulator, phase-shift circuit 35 shown in FIG. 3 uses separate oscillator 40 as input to a frequency divider consisting of D flip-flops 50–55. Phase-shift circuit 35 provides accurate phase shifts of 90° in a four-phase system at the expense of more circuitry. Different phase-shifts may be provided by cascading additional D flip-flops. Depending on the amount of phase shift that is required, i.e., depending on the number of phases in the system, the resulting circuitry can be very complicated. Further, phase-shift circuit 35 is inflexible when incorporated inside an integrated circuit as it can only provide certain values of phase shift, e.g., 90°, 120°, and 180°.

To date, there are no simple phase-shift circuits that provide a wide range of accurate phase shifts for use in interleaved switching voltage regulator systems and in other applications. Further, there are no phase shift circuits that may be programmed to provide any amount of phase shift without requiring non-trivial control circuit or significant changes in the circuitry with each phase shift.

In view of the foregoing, it would be desirable to provide circuits and methods for accurately setting a phase shift.

It further would be desirable to provide circuits and methods for setting any amount of pre-programmed phase shift.

It also would be desirable to provide circuits and methods for setting any amount of phase shift without requiring significant changes in the circuitry with each phase shift.

SUMMARY OF THE INVENTION

In view of the foregoing, it is an object of the present invention to provide circuits and methods for accurately setting a phase shift.

It is a further object of the present invention to provide circuits and methods for setting any amount of pre-programmed phase shift.

It also is an object of the present invention to provide circuits and methods for setting any amount of phase shift without requiring significant changes in the circuitry with each phase shift.

These and other objects of the present invention are accomplished by providing circuits and methods for accurately setting any amount of pre-programmed phase shift without requiring significant changes in the circuitry with each phase shift. In one embodiment, the input signal is applied to the clock of a latch element such as a D flip-flop connected to a delay element such as R-C circuit 20 shown in FIG. 2 to provide an output signal that is out of phase with the input signal with an initialization element such as diode 77, as shown in FIG. 4. Circuit 70 of FIG. 4 achieves a constant phase shift that depends on the values used for resistor 80 and capacitor 85. However, the phase shift may be inaccurate due to the frequency sensitivities and production variations of capacitor 85 and the threshold variation of the CLR threshold of D flip-flop 75.

In a preferred embodiment, the input signal is applied to a latch element connected to a low-pass filter and a timer, such that the timer's delay is controlled by an amplifier with a feedback as shown in FIG. 5. Circuit 90 shown in FIG. 5 is a closed-loop circuit that provides any amount of accurate phase shift by setting an input voltage to the inverting input of amplifier 105. Circuit 90 has no operating frequency restrictions, and, more importantly, no frequency-sensitive components are used to set the phase shift.

Circuit 90 may be implemented in a number of ways, such as, for example, circuits 155 and 265 shown in FIGS. 7 and 10, respectively. In circuit 155 of FIG. 7, latch 95 is implemented with D flip-flop 160, low-pass filter 100 is implemented with an R-C low-pass filter consisting of resistor R3 (165) and capacitor C2 (170), timer 115 is implemented with an R-C analog delay circuit consisting of resistor R4 (200) and capacitor C3 (205) with MOSFET M1 (210) being used to initialize the timer formed by resistors R4 (200) and capacitor C3 (205), amplifier 105 is implemented with operational amplifier 190, and feedback 110 is implemented with capacitor C1 (195) along with resistive divider 175. The input voltage applied to the inverting input of operational amplifier 190 is also set by resistive divider 175.

Alternatively, circuit 90 may be implemented by combining two or more of latch 95, low-pass filter 100, amplifier 105, feedback 110, and timer 115 in one or more functional circuit units instead of using one functional circuit unit for each one of latch 95, low-pass filter 100, amplifier 105, feedback 110, and timer 115. For example, in circuit 265, capacitor C1 (290) is used to implement both feedback 110 and the capacitor of an R-C low-pass filter implementation of low-pass filter 100, with R3 (275) serving as the resistor in the R-C low-pass filter and the Q output of D flip-flop 270 (instead of the $\overline{Q}$ output as used in circuit 155) being used to initialize the timer. As a result of this combination, the polarity of amplifier 105 is reversed in amplifier 305, and the input voltage is applied to the non-inverting input of amplifier 305. Similar to circuit 155, this voltage is set by a resistive divider (295, 300).

Advantageously, the present invention enables any amount of pre-programmed phase shift to be set without requiring significant changes in the circuitry with each phase shift. In addition, the present invention may be implemented in multiple ways, by using different components for latch 95, low-pass filter 100, amplifier 105, feedback 110, and timer 115.

For example, latch 95 may be implemented with a D flip-flop, an R-S flip-flop, or a J-K flip-flop, among others. Low-pass filter 100 may be implemented with a $1^{st}$ order R-C filter, a $2^{nd}$ order R-C filter, or with any other type of low-pass filter. Amplifier 105 may be implemented with an operational amplifier, a transconductance amplifier, a transistor-based amplifier, etc., feedback 110 may take numerous forms, such as a single-pole integrator, a multiple pole and zero network, etc., and timer 115 may be implemented as an R-C analog delay circuit, a voltage-controlled current source charging a capacitor, or a voltage-controlled oscillator followed by a digital counter, among others. Lastly, two or more of latch 95, low-pass filter 100, amplifier 105, feedback 110, and timer 115 may be combined in one or more functional circuit units.

BRIEF DESCRIPTION OF THE DRAWINGS

The foregoing and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
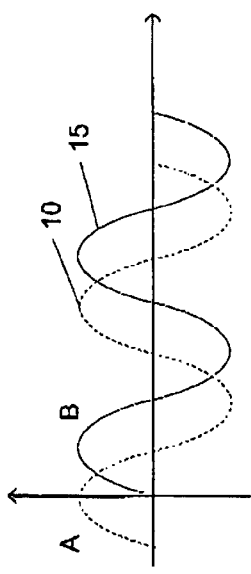
FIG. 1 is an illustrative diagram of two signals A and B that are out of phase by 90°.
Figure 2:
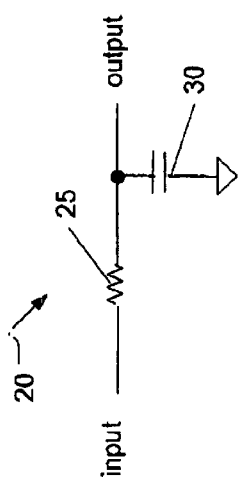
FIG. 2 is a schematic diagram of an illustrative R-C circuit that may be used to shift an input signal by a certain degree to generate a phase-shifted output signal.
Figure 3:
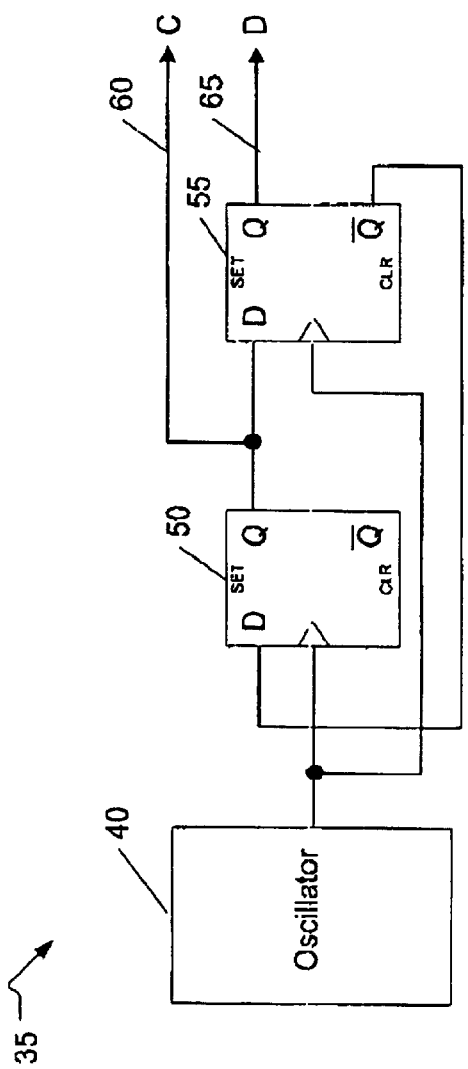
FIG. 3 is a schematic diagram of an illustrative prior art phase-shift circuit.
Figure 4:
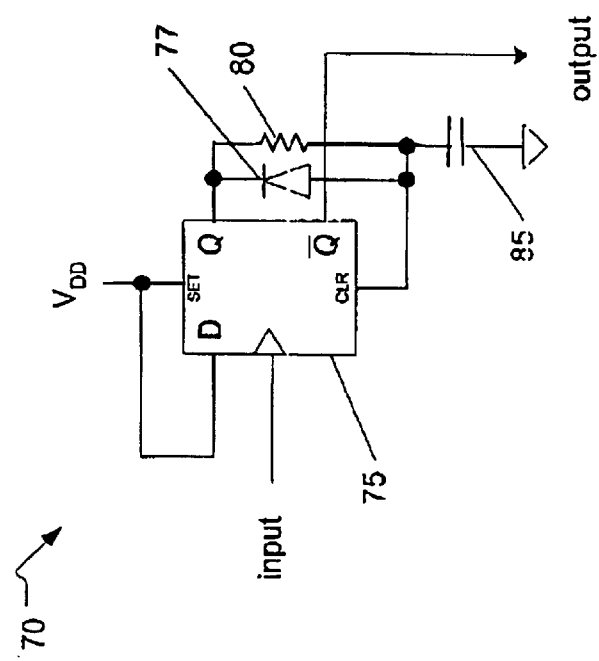
FIG. 4 is a schematic diagram of an exemplary embodiment of a phase-shift circuit built in accordance with the principles of the present invention.

Referring now to FIG. 4, a schematic diagram of an exemplary embodiment of a phase-shift circuit built in accordance with the principles of the present invention is described. Phase-shift circuit 70 is composed of a latch element such as D flip-flop 75 connected to a delay element such as R-C circuit formed by resistor 80 and capacitor 85 with diode 77 to initialize the timer formed by resistor 80 and capacitor 85. The D input of D flip-flop 75 is connected to the positive voltage rail. The Q output is asserted with each rising edge of the clock input until D flip-flop 75 is cleared by the R-C circuit. The R-C circuit resets D flip-flop 75 to generate a phase-shift in output $\overline{Q}$ as compared to the clock input. The amount of phase-shift is determined by the values of resistor 80, capacitor 85, and the CLR threshold voltage of D flip-flop 75. As a result, the phase shift may be inaccurate due to the frequency sensitivities and production variations of capacitor 85 and production variations of the CLR threshold voltage.

Figure 5:
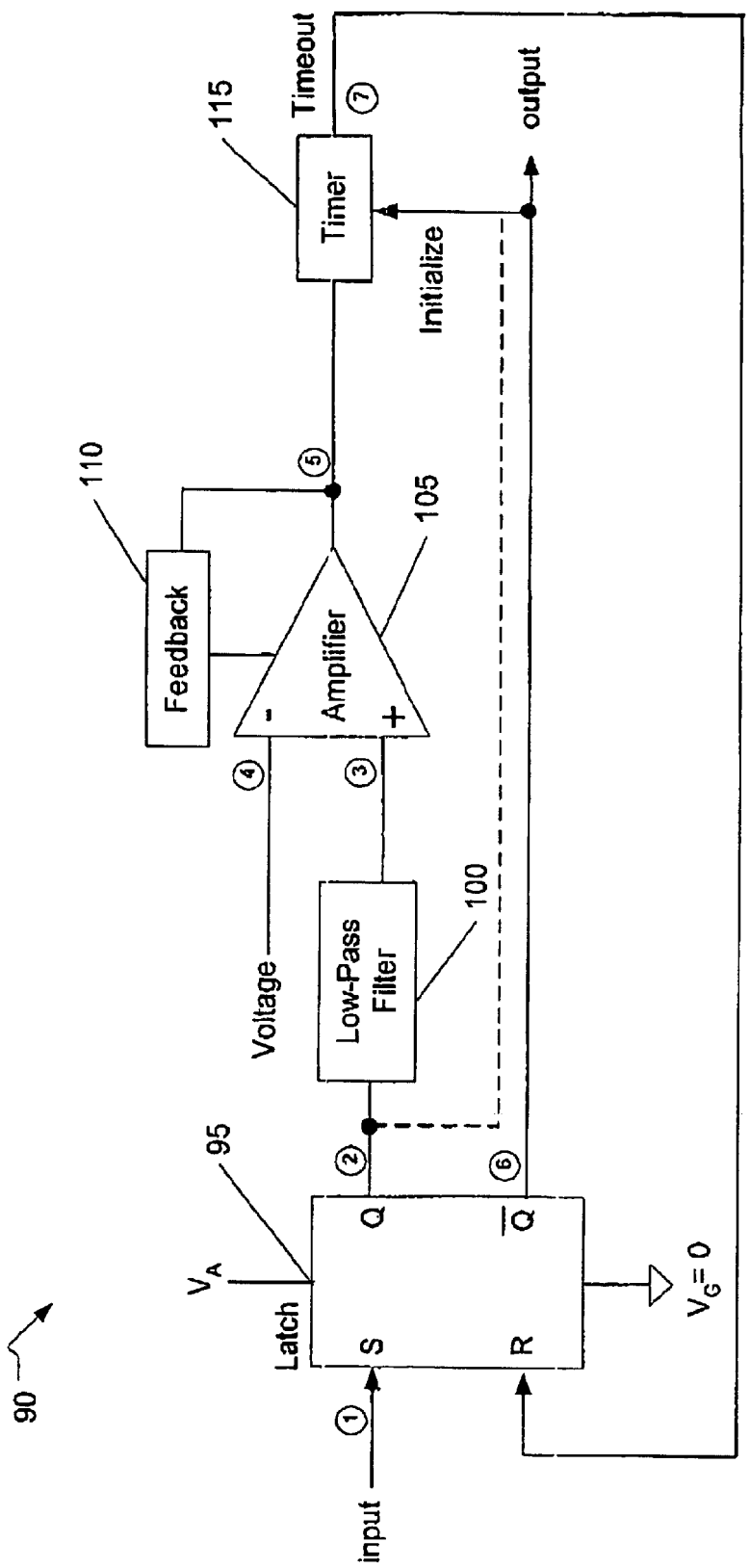
FIG. 5 is a schematic diagram of a preferred embodiment of a phase-shift circuit built in accordance with the principles of the present invention.

Referring now to FIG. 5, a schematic diagram of a preferred embodiment of a phase-shift circuit built in accordance with the principles of the present invention is described. Phase-shift circuit 90 has latch 95 connected to low-pass filter 100 and timer 115, such that timer 115's delay is controlled by amplifier 105 with feedback 110. Circuit 90 is a closed-loop circuit that provides any amount of accurate phase shift between an input signal and an output signal. Circuit 90 has no operating frequency restrictions, and, more importantly, no frequency-sensitive components are used to set the phase shift between the input signal and the output signal.

Phase-shift circuit 90 operates as follows: at the rising edge of the input signal, the Q output of latch 95 is asserted and the $\overline{Q}$ output is de-asserted. That is, the input signal is in phase with the Q output of latch 95 but not in phase with the $\overline{Q}$ output, as they are complementary in logic. Further, the input signal and the Q output of latch 95 have the same frequency since every rising edge of the input signal asserts the Q output of latch 95 and only a rising edge of the input signal can assert the Q output of latch 95. Similarly, the $\overline{Q}$ output of latch 95 is of the same frequency as the Q output, but as they are complementary in logic, Q and $\overline{Q}$ are out of phase.

Either Q or $\overline{Q}$ of latch 95 is connected to timer 115 so that the rising edge of Q or the falling edge of $\overline{Q}$ initializes timer 115. Timer 115 then starts to count a given time duration. When the time duration expires, timer 115 sends a "timeout" signal to latch 95, which has the effect of resetting Q and asserting $\overline{Q}$. This results in a phase-shift $\Delta\theta$ between the rising edges of Q and $\overline{Q}$.

Figure 6:
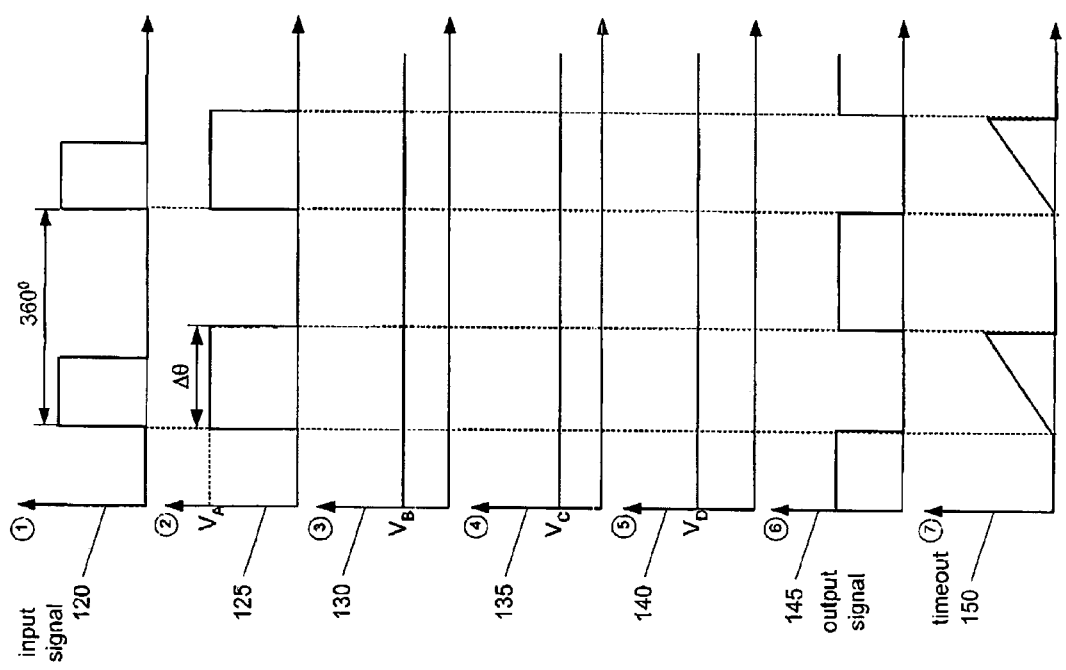
FIG. 6 is an illustrative timing diagram corresponding to the operation of the phase-shift circuit of FIG. 5.

The phase shift $\Delta\theta$ between the rising edges of Q and $\overline{Q}$, or the phase shift $\Delta\theta$ between the input signal and the output signal may be precisely set by the closed-loop formed with low-pass filter 100 and amplifier 105 with feedback 110, as follows: first, low-pass filter 100 averages the voltage of Q's waveform that pulsates between $V_A$ and $V_G$, as shown in FIG. 6. For illustrative purposes, $V_G$ is set to ground. As a result of this averaging, low-pass filter 100 provides a DC voltage $V_B$ with an amplitude of:

$$V_B = \delta \times V_A \quad (1)$$

where $\delta$ is Q's duty cycle, or the percentage of time during which Q is asserted over the total periodic time between two input pulses.

Second, the phase shift $\delta\theta$ between the rising edges of Q and $\overline{Q}$ is proportional to Q's duty cycle $\delta$ so that:

$$\frac{\Delta\theta}{360°} = \delta \quad (2)$$

Substituting equation (2) into equation (1) results in equation (3) below:

$$V_B = \frac{\Delta\theta}{360°} \times V_A \quad (3)$$

Third, amplifier 105 compares $V_B$ with reference voltage $V_C$ applied at its inverting input and feedback 110 forces a DC voltage $V_D$ so that the error between $V_B$ and $V_C$ is minimized, that is:

$$V_B = V_C \qquad (4)$$

Lastly, timer 115 is constructed so that its time duration is controlled by its input voltage $V_D$. If $V_D$ is adjusted higher, e.g., when Q experiences an instantaneous δ increase, timer 115 reduces its delay time and resets latch 95 sooner. This negative feedback reduces Q's pulse width and corrects the initial δ increase.

With the closed loop, $V_B$ is forced to be the same as the reference voltage $V_C$, so that:

$$V_C = \frac{\Delta\theta}{360°} \times V_A \qquad (5)$$

Therefore, the phase shift Δθ between the input signal and the output signal may be set by the reference voltage $V_C$ as follows:

$$\Delta\theta = \frac{V_C}{V_A} \times 360° \qquad (6)$$

The phase shift Δθ is accurate since circuit 90 is a closed-loop system that has no operating frequency restrictions and does not use any frequency-sensitive components to set the phase shift.

It should be understood by one skilled in the art that latch 95 may be implemented with a D flip-flop, an R-S flip-flop, or a J-K flip-flop, among others. It should also be understood by one skilled in the art that low-pass filter 100 may be implemented as a $1^{st}$ order R-C filter, a $2^{nd}$ order R-C filter, or as any other type of low-pass filter.

Further, it should be understood by one skilled in the art that amplifier 105 may be implemented with an operational amplifier, a transconductance amplifier, a transistor-based amplifier, etc., feedback 110 may take numerous forms, such as a single-pole integrator, a multiple pole and zero network, etc., and timer 115 may be implemented with a R-C analog delay circuit, a voltage-controlled current source charging a capacitor, or a voltage-controlled oscillator followed by a digital counter, among others. Lastly, it should also be understood by one skilled in the art that two or more of latch 95, low-pass filter 100, amplifier 105, feedback 110, and timer 115 may be combined in one or more functional circuit units.

Referring now to FIG. 6, an illustrative timing diagram corresponding to the operation of the phase-shift circuit of FIG. 5 is described. Input signal waveform 120 is shown to be in phase with waveform 125 corresponding the Q output of latch 95. The phase shift Δθ between the input signal and the output signal is shown in waveform 125 to be generated according to timeout signal (150) of timer 115, that is controlled by, amplifier 105 with feedback 110.

It should be understood by one skilled in the art that timeout waveform 150 is shown to be a sawtooth waveform to illustrate an exemplary implementation of timer 115. Other implementations of timer 115 may result in other types of timeout waveform 150, such as an exponential timeout waveform 150 and a zig-zag timeout waveform 150, among others.

Figure 7:
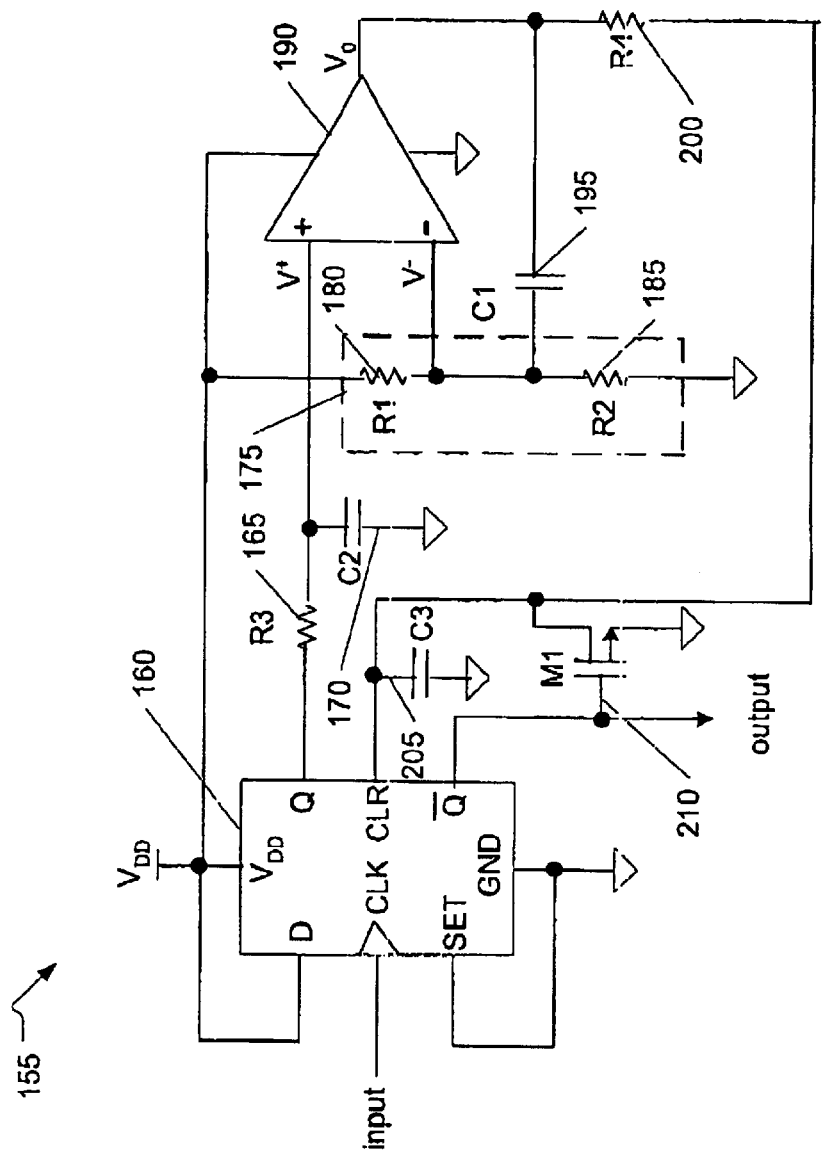
FIG. 7 is a schematic diagram of an exemplary implementation of the phase-shift circuit of FIG. 5.

Referring now to FIG. 7, a schematic diagram of an exemplary implementation of the phase-shift circuit of FIG. 5 is described. In circuit 155, latch 95 is implemented with D flip-flop 160, low-pass filter 100 is implemented with an R-C low-pass filter consisting of resistor R3 (165) and capacitor C2 (170), timer 115 is implemented with an R-C analog delay circuit consisting of resistor R4 (200) and capacitor C3 (205) with MOSFET M1 (210) being used to initialize the timer formed by resistors R4 (200) and capacitor C3 (205), amplifier 105 is implemented with operational amplifier 190 and its feedback 110 is implemented with capacitor C1 (195) along with resistive divider 175. The input voltage applied to the inverting input of operational amplifier 210 is also set by resistive divider 175.

Phase-shift circuit 155 operates as follows: since the D input is connected to the positive voltage rail, at the rising edge of the clock input, the Q output of D flip-flop 160 is asserted with each rising edge of the clock input that is, the clock input and the Q output of D flip-flop 160 are in phase. In addition, the clock input and the Q output of D flip-flop 160 have the same frequency since every rising edge of the clock input asserts the Q output of D flip-flop 160 and only a rising edge of the clock input can assert the Q output of D flip-flop 160.

The other output $\overline{Q}$ of flip-flop 160 is of the same frequency as the Q output, but complementary in logic. That is, Q and $\overline{Q}$ are not in phase. The phase shift Δθ between the rising edges of Q and $\overline{Q}$, or the phase shift between the clock input and the output, is proportional to Q's duty cycle δ:

$$\frac{\Delta\theta}{360°} = \delta \qquad (7)$$

When Q is asserted, $\overline{Q}$ is de-asserted, turning off MOSFET M1 (210) and releasing capacitor C3 (205) from being discharged. The output of operational amplifier 190 then starts to charge C3 (205) through resistor R4 (200). When the voltage across C3 (205) reaches D flip-flop 160's CLR threshold, D flip-flop 160 is reset and output Q is de-asserted.

The amount of phase shift is determined by the values of resistors R1 (180) and R2 (185) in resistive divider 175 as follows: with a R-C low-pass filter formed by resistor R3 (165) and capacitor C2 (170) between Q and the non-inverting input $V^+$ of operational amplifier 190, the voltage at $V^+$ is the DC average voltage of Q. Assuming $Q = V_{DD}$ when asserted, and $Q = 0$ when de-asserted, Q's average voltage is the product of $V_{DD}$ and Q's duty cycle δ, that is:

$$V^+ = V_{DD} \times \delta \qquad (8)$$

With resistive divider 175 between $V_{DD}$ and the inverting input $V^-$ of operational amplifier 190, the voltage at $V^-$ is:

$$V^- = V_{DD} \times \frac{R2}{R1 + R2} \qquad (9)$$

Operational amplifier 190 servers as negative feedback, that is, if the non-inverting input $V^+$ is higher than the inverting input $V^-$, feedback capacitor C1 (195) integrates this error and increases the output voltage $V_0$. A higher $V_0$ shortens capacitor C3's (205) charging time and produces a narrower pulse width at Q. This reduces Q's duty cycle δ in Equation (7), thereby decreasing $V^+$ to a value closer to $V^-$. Similarly, if $V^+$ is lower than $V^-$, operational amplifier 190 reduces its output voltage $V_0$ to make C3's (205) charging time longer. Eventually, $V^+$ will be enforced to be the same as $V^-$, i.e., $V^+ = V^-$, and the output voltage $V_0$ will stabilize into a DC voltage. With $V^+$ set as in Equation (8) and $V^-$ set as in Equation (9), Q's duty cycle δ is therefore determined by:

$$\delta = \frac{R2}{R1+R2} \quad (10)$$

Lastly, with Q's duty cycle δ proportional to the phase shift Δθ between the clock input and the output $\overline{Q}$, the phase shift Δθ given by circuit 155 is as follows:

$$\Delta\theta = \frac{R2}{R1+R2} \times 360° \quad (11)$$

Therefore, circuit 155 may be pre-programmed to achieve any amount of phase shift by setting the values of resistors R1 (180) and R2 (185) in resistive divider 175. Furthermore, the phase shift is accurate since circuit 155 is a closed-loop system that has no operating frequency restrictions and does not use any frequency-sensitive components to set the phase shift. Variations in supply voltage are also effectively rejected by circuit 155 as the DC level of Q and the inverting voltage V⁻ of operational amplifier 190 are both proportional to $V_{DD}$.

Figure 8:
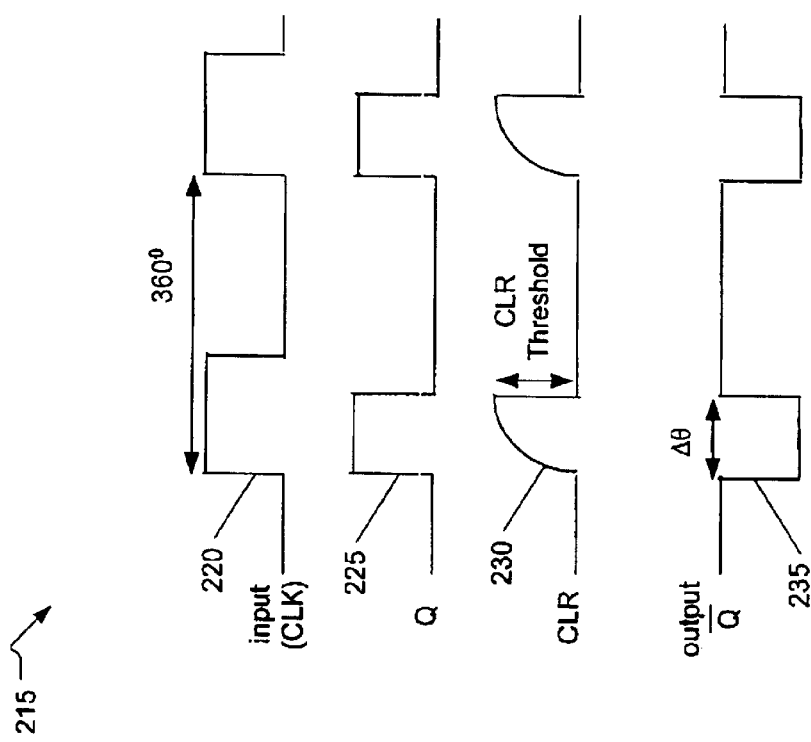
FIG. 8 is an illustrative timing diagram corresponding to the operation of the phase-shift circuit of FIG. 7.

Referring now to FIG. 8, an illustrative timing diagram corresponding to the operation of the phase-shift circuit of FIG. 7 is described. Timing diagram 215 shows the waveforms of the clock input (220), D flip-flop 160's CLR threshold (230), and D flip-flop 160's outputs Q (225) and $\overline{Q}$ (235).

As described above, with each rising edge of the clock input, the Q output is asserted, that is, the clock input and the Q output of D flip-flop 160 are in phase. The other output $\overline{Q}$ of flip-flop 160 is of the same frequency as the Q output, but complementary in logic. That is, Q and $\overline{Q}$ are not in phase. When Q is asserted, $\overline{Q}$ is de-asserted, turning off MOSFET M1 (210) and releasing capacitor C3 (205) from being discharged. The output of operational amplifier 190 then starts to charge C3 (205) through resistor R4 (200). When the voltage across C3 (205) reaches D flip-flop 160's CLR threshold, D flip-flop 160 is reset and output Q is de-asserted. The phase shift Δθ given by circuit 155 is illustrated in $\overline{Q}$'s waveform (235).

Figure 9:
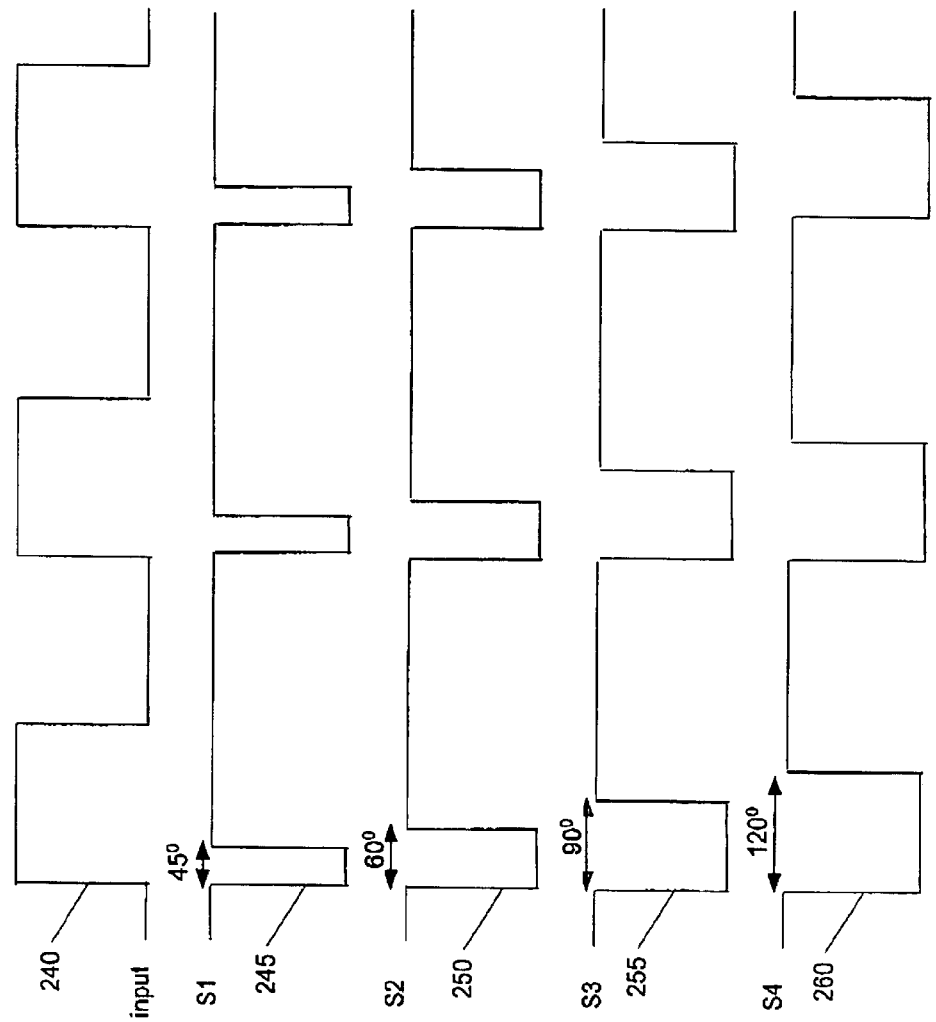
FIG. 9 is an illustrative timing diagram corresponding to an input signal and output signals that may be generated by the phase-shift circuit of FIG. 7.

Referring now to FIG. 9, an illustrative timing diagram corresponding to an input signal and output signals that may be generated by the phase-shift circuit of FIG. 7 is described. Signals S1 (245), S2 (250), S3 (255), and S4 (260) are out of phase with input signal 240, with each signal having a different phase shift. Signal S1 (245) is 45° out of phase with input signal 240, signal S2 (250) is 60° out of phase with input signal 240, signal S3 (255) is 90° out of phase with input signal 240, and signal S4 (260) is 120° out of phase with input signal 240. These phase shifts may be achieved by circuit 155 by setting the ratio R2/(R1+R2) in resistive divider 175 as follows:

$$\frac{R2}{R1+R2} = \frac{1}{8}, \text{ for } \Delta\theta = 45° \quad (12)$$

$$\frac{R2}{R1+R2} = \frac{1}{6}, \text{ for } \Delta\theta = 60° \quad (13)$$

$$\frac{R2}{R1+R2} = \frac{1}{4}, \text{ for } \Delta\theta = 90° \quad (14)$$

$$\frac{R2}{R1+R2} = \frac{1}{3}, \text{ for } \Delta\theta = 120° \quad (15)$$

Other amounts of phase shift may be easily obtained by using different values for resistors R1 (180) and R2 (185).

Figure 10:
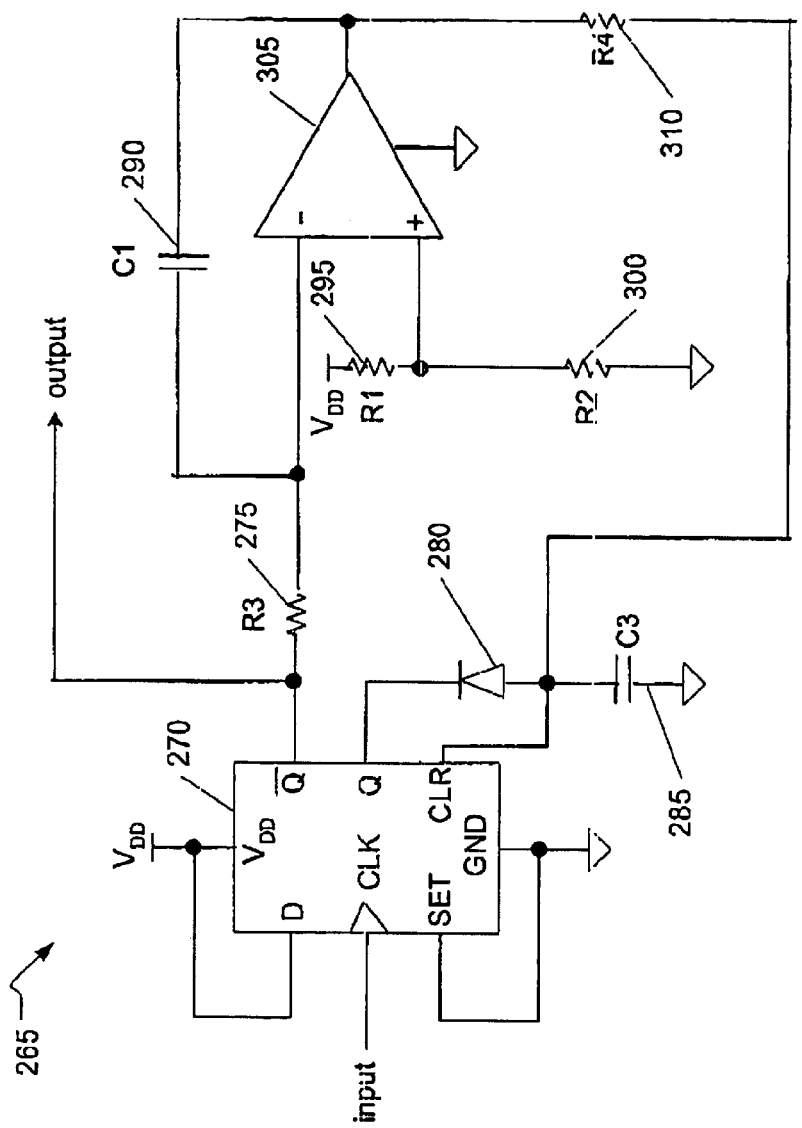
FIG. 10 is a schematic diagram of another exemplary implementation of the phase-shift circuit of FIG. 5.

Referring now to FIG. 10, a schematic diagram of another exemplary implementation of the phase-shift circuit of FIG. 5 is described. In circuit 265, capacitor C1 (290) is used to implement both feedback 110 and the capacitor of an R-C low-pass filter implementation of low-pass filter 100, with R3 (275) serving as the resistor in the R-C low-pass filter. As a result of this combination, the polarity of amplifier 105 is reversed in amplifier 305, and the input voltage is applied to the non-inverting input of amplifier 305. Also, Q (instead of $\overline{Q}$) is used to initialize the timer formed by resistor R4 (310) and capacitor C3 (285). Similar to circuit 155, the input voltage is set by a resistive divider (295, 300).

Compared to circuit 155 of FIG. 7, circuit 265 uses diode 280 instead of MOSFET M1 (210) to initialize the timer formed by resistor R4 (310) and capacitor C3 (285). Circuit 265 also eliminates capacitor C2 (170) and it uses capacitor C1 (290) for both filtering and integrating.

Although particular embodiments of the present invention have been described above in detail, it will be understood that this description is merely for purposes of illustration. Specific features of the invention are shown in some drawings and not in others, for purposes of convenience only, and any feature may be combined with other features in accordance with the invention. Steps of the described processes may be reordered or combined, and other steps may be included. Further variations will be apparent to one skilled in the art in light of this disclosure and such variations are intended to fall within the scope of the appended claims.

What is claimed is:

1. A circuit for providing a phase shift between an input signal and an output signal, the circuit comprising:
   a latch circuit for receiving the input signal and providing a first output and a second output having the same frequency as the input signal;
   a low-pass filter circuit for receiving the first input from the latch circuit and providing a filtered output;
   a timer circuit for receiving the first or the second output from the latch circuit as an initialization input, the timer circuit comprising a control input and providing a timeout signal; and
   an amplifier circuit with a feedback for providing a control voltage at the control input of the timer circuit, the amplifier circuit comprising a first input connected to an input voltage and a second input connected to the filtered output of the low-pass filter circuit,
   wherein the input voltage is proportional to the phase shift between the input signal and the output signal.

2. The circuit of claim 1, wherein the second output of the latch circuit comprises the output signal.

3. The circuit of claim 1, wherein the latch circuit comprises one of: a D flip-flop; a R-S flip-flop; a T flip-flop; and a J-K flip-flop.

4. The circuit of claim 1, wherein the timer circuit comprises one of: an R-C analog delay circuit; a voltage-controlled current source charging a capacitor; and a voltage-controlled oscillator connected to a digital counter.

5. The circuit of claim 1, wherein an initialization element is connected between the first or second output of the latch circuit and the timer circuit.

6. The circuit of claim 5, wherein the initialization element comprises one of: a diode; a JFET; a MOSFET; and a BJT.

7. The circuit of claim 1, wherein the amplifier circuit comprises one of: an operational amplifier; a transconductance amplifier; and a transistor-based amplifier.

8. The circuit of claim 1, wherein the input voltage is set by a resistive divider or a separate reference voltage.

9. The circuit of claim 1, wherein the feedback circuit comprises a single-pole integrator.

10. The circuit of claim 1, wherein the feedback circuit comprises a multiple-pole and zero network.

11. The circuit of claim 1, wherein the input voltage is proportional to the duty cycle of the first output from the latch circuit.

12. The circuit of claim 1, wherein the phase shift comprises the ratio between the values of the reference voltage and the peak-to-valley voltage amplitude of the first output from the latch circuit, wherein the ratio is multiplied by 360°.

13. The circuit of claim 1, wherein the low-pass filter circuit and the feedback circuit are combined in a single functional circuit unit.

14. A method for providing a phase shift between an input signal and an output signal, the method comprising:
   providing a latch circuit for receiving the input signal, the latch circuit comprising a first output and a second output having the same frequency as the input signal;
   low-pass filtering the first output from the latch circuit;
   initializing a timer based on the first or second output from the latch circuit;
   resetting the latch circuit when the timer expires; and
   controlling the timer duration with a DC control voltage provided by an amplifier circuit with a feedback, the amplifier circuit comprising an input connected to an input voltage,
      wherein the input voltage is proportional to the phase shift between the input signal and the output signal.

15. The method of claim 14, wherein the second output from the latch circuit comprises the output signal.

16. The method of claim 14, wherein providing a latch circuit comprises providing one of: a D flip-flop; a R-S flip-flop; a T flip-flop; and a J-K flip-flop.

17. The method of claim 14, wherein low-pass filtering the first output from the latch circuit further comprises providing a DC voltage at an input of the amplifier circuit, wherein the DC voltage is proportional to the duty cycle of the first output from the latch circuit.

18. The method of claim 14, wherein initializing a timer based on the first or second output from the latch circuit comprises initializing the timer with an initialization element connected between the second output from the latch circuit and the timer.

19. The method of claim 14, wherein the initialization element comprises one of: a diode; a JFET; a MOSFET; and a BJT.

20. The method of claim 14, wherein the timer comprises one of: an R-C analog delay circuit; a voltage-controlled current source charging a capacitor; and a voltage-controlled oscillator connected to a digital counter.

21. The method of claim 14, wherein the amplifier circuit comprises one of: an operational amplifier; a transconductance amplifier; and a transistor-based amplifier.

22. The method of claim 14, wherein the feedback comprises a single-pole integrator.

23. The method of claim 14, wherein the feedback comprises a multiple-pole and zero network.

24. The method of claim 23, wherein setting the DC voltage as the input voltage comprises setting the input voltage to be proportional to the duty cycle of the first output of the latch circuit.

25. The method of claim 14, wherein the input voltage is set by a resistive divider or a separate reference voltage.

26. The method of claim 14, wherein the phase shift comprises the ratio between the values of the input voltage and the peak-to-valley voltage amplitude of the first output from the latch circuit, wherein the ratio is multiplied by 360°.

* * * * *

UNITED STATES PATENT AND TRADEMARK OFFICE
CERTIFICATE OF CORRECTION

PATENT NO. : 6,744,296 B1
DATED : June 1, 2004
INVENTOR(S) : Yuhui Chen et al.

It is certified that error appears in the above-identified patent and that said Letters Patent is hereby corrected as shown below:

Column 1,
Line 14, change "but" to -- out --

Column 3,
Line 5, change "fist" to -- first --

Column 6,
Line 53, change "$\delta\theta$" to -- $\Delta\theta$ --

Column 8,
Line 54, change "servers" to -- serves --

Column 9,
Line 26, delete "threshold"

Signed and Sealed this

Seventh Day of June, 2005

JON W. DUDAS
*Director of the United States Patent and Trademark Office*